United States Patent
Shiwaku

(10) Patent No.: US 7,578,240 B2
(45) Date of Patent: Aug. 25, 2009

(54) OVERHEAD TRAVELING VEHICLE SYSTEM AND ARTICLE STORAGE METHOD IN THE OVERHEAD TRAVELING VEHICLE SYSTEM

(75) Inventor: Tamotsu Shiwaku, Inuyama (JP)

(73) Assignee: Murata Kikai Kabushiki Kaisha, Kyoto-shi (JP)

( * ) Notice: Subject to any disclaimer, the term of this patent is extended or adjusted under 35 U.S.C. 154(b) by 68 days.

(21) Appl. No.: 11/651,589

(22) Filed: Jan. 10, 2007

(65) Prior Publication Data

US 2007/0163461 A1 Jul. 19, 2007

(30) Foreign Application Priority Data

Jan. 17, 2006 (JP) .............................. 2006-008482

(51) Int. Cl.
*B61B 3/00* (2006.01)
*B61J 3/00* (2006.01)

(52) U.S. Cl. ...................................... 104/89; 104/88.01

(58) Field of Classification Search ............. 104/88.01, 104/89, 87; 701/200
See application file for complete search history.

(56) References Cited

U.S. PATENT DOCUMENTS

| | | | | |
|---|---|---|---|---|
| 6,721,627 | B2 * | 4/2004 | Udou et al. ................. | 700/228 |
| 2004/0126208 | A1 * | 7/2004 | Tawyer et al. ........... | 414/222.02 |
| 2005/0159854 | A1 * | 7/2005 | Hori et al. ................. | 701/1 |
| 2005/0171656 | A1 * | 8/2005 | Hori et al. ................. | 701/19 |
| 2006/0016363 | A1 * | 1/2006 | Nakao et al. ............. | 104/88.01 |
| 2006/0051188 | A1 * | 3/2006 | Hoshino ..................... | 414/277 |
| 2006/0051192 | A1 * | 3/2006 | Fujiki ......................... | 414/626 |
| 2006/0182553 | A1 * | 8/2006 | Yamamoto et al. ........ | 414/278 |
| 2006/0222479 | A1 * | 10/2006 | Shiwaku et al. ............ | 414/267 |
| 2006/0230975 | A1 * | 10/2006 | Shiwaku .................. | 104/88.01 |
| 2006/0271252 | A1 * | 11/2006 | Hori et al. .................. | 701/23 |
| 2007/0027615 | A1 * | 2/2007 | Nagasawa ................. | 701/200 |
| 2007/0163461 | A1 * | 7/2007 | Shiwaku ..................... | 104/89 |

FOREIGN PATENT DOCUMENTS

| | | | |
|---|---|---|---|
| JP | 06019548 A | * | 1/1994 |
| JP | 2005-206371 A | | 8/2005 |

* cited by examiner

*Primary Examiner*—S. Joseph Morano
*Assistant Examiner*—Jason C Smith
(74) *Attorney, Agent, or Firm*—Westerman, Hattori, Daniels & Adrian, LLP.

(57) ABSTRACT

Buffers 6, 8 are provided on both sides of a travel rail 10. An overhead traveling vehicle 4 has a SCARA arm movable back and forth to both of the left and right so that a rotation unit 22 and an elevation drive unit 4 can move to a position above either of the buffers 6, 8.

4 Claims, 7 Drawing Sheets

OVERHEAD TRAVELING VEHICLE SYSTEM AND ARTICLE STORAGE METHOD IN THE OVERHEAD TRAVELING VEHICLE SYSTEM

TECHNICAL FIELD

The present invention relates to an overhead traveling vehicle system in which buffers are provided on both left and right sides of a travel rail.

BACKGROUND ART

In Japanese Laid-Open Patent Publication No. 2005-206371, the applicant proposed to provide an overhead traveling vehicle system in which a buffer is provided on one side of a travel rail. Thereafter, the applicant studied to further improve the storage capacity of the buffer to achieve the present invention.

SUMMARY OF THE INVENTION

An object of the present invention is to increase the number of articles stored in buffers, utilizing an overhead space, for further improving the transportation efficiency in an overhead traveling vehicle system.

Another object of the present invention is to provide buffers for storing articles, utilizing empty spaces above processing equipment.

Still another object of the present invention is to provide a common buffer between an overhead traveling vehicle on a normal lane and an overhead traveling vehicle žon an overtaking lane.

According to the present invention, an overhead traveling vehicle system includes a travel rail for an overhead traveling vehicle provided along processing equipment having a load port. The overhead traveling vehicles have lateral movement means for moving an elevation frame for support and transfer of an article to left and right sides of the travel rail. The lateral movement means can laterally move the elevation frame to both of the left and right sides of the travel rail. Buffers for temporarily storing the article are provided in respective spaces on both of the left and right sides of the travel rail.

Further, according to the present invention, a method of storing an article using an overhead traveling vehicle system is provided. The overhead traveling vehicle system includes a travel rail for an overhead traveling vehicle along processing equipment having a load port. The overhead traveling vehicle has an elevation frame which can be elevated/lowered for support and transfer of the article. The overhead traveling vehicles have lateral movement means capable of laterally moving the elevation frame to both of left and right sides of the travel rail. Buffers for temporarily storing the article are provided in respective spaces on both of left and right sides of the travel rail. The overhead traveling vehicles laterally move the elevation frame to a position above the buffer using the lateral movement means, and elevate/lower the elevation frame for transferring the article from/to the buffer.

Preferably, the travel rail is provided to pass over the load port, and the buffers are provided at both of a position above the processing equipment, and a position opposite to the processing equipment as viewed from the travel rail.

Further, preferably, the travel rail is a travel rail in a normal lane, and the overhead traveling vehicle system further includes a travel rail in an overtaking lane, and a buffer to which the article can be transferred from the overhead traveling vehicles traveling along either of the travel rail in the normal lane and the travel rail in the overtaking lane.

ADVANTAGES OF THE INVENTION

In the present invention, since spaces on both left and right sides of the travel rail are utilized for providing buffers, it is possible to increase the number of buffers, and consequently, improvement in the transportation efficiency is achieved.

The travel rail is provided to pass over a load port, and the buffers are provided at both of a position above the processing equipment and a position opposite to the processing equipment as viewed from the travel rail. In this manner, it is possible to increase the number of buffers using empty spaces above the processing equipment.

Preferably, a common buffer is provided between a travel rail in a normal lane and a travel rail in an overtaking lane such that an article can be transferred to the common rail from the overhead traveling vehicles traveling along either of the travel rail in the normal lane and the travel rail in the overtaking lane. This arrangement is made possible because the overhead traveling vehicles can move the elevation frame laterally to both sides of the travel rail. Thus, though not specially limited to, the following advantages can be obtained.

For example, it is possible to transport an article from a load port to the common buffer by the overhead traveling vehicle on the travel rail in the normal lane, and then, transport the article from the common buffer to a destination point by the overhead traveling vehicles on the travel rail in the overtaking lane, and conversely, it is possible to transport an article to the common buffer by the overhead traveling vehicles on the travel rail in the overtaking lane, and then, transport the article from the common buffer to the load port. Moreover, it is possible to increase the number of available buffers for both of the travel rail in the overtaking lane and the travel rail in the normal lane.

Figure 1:
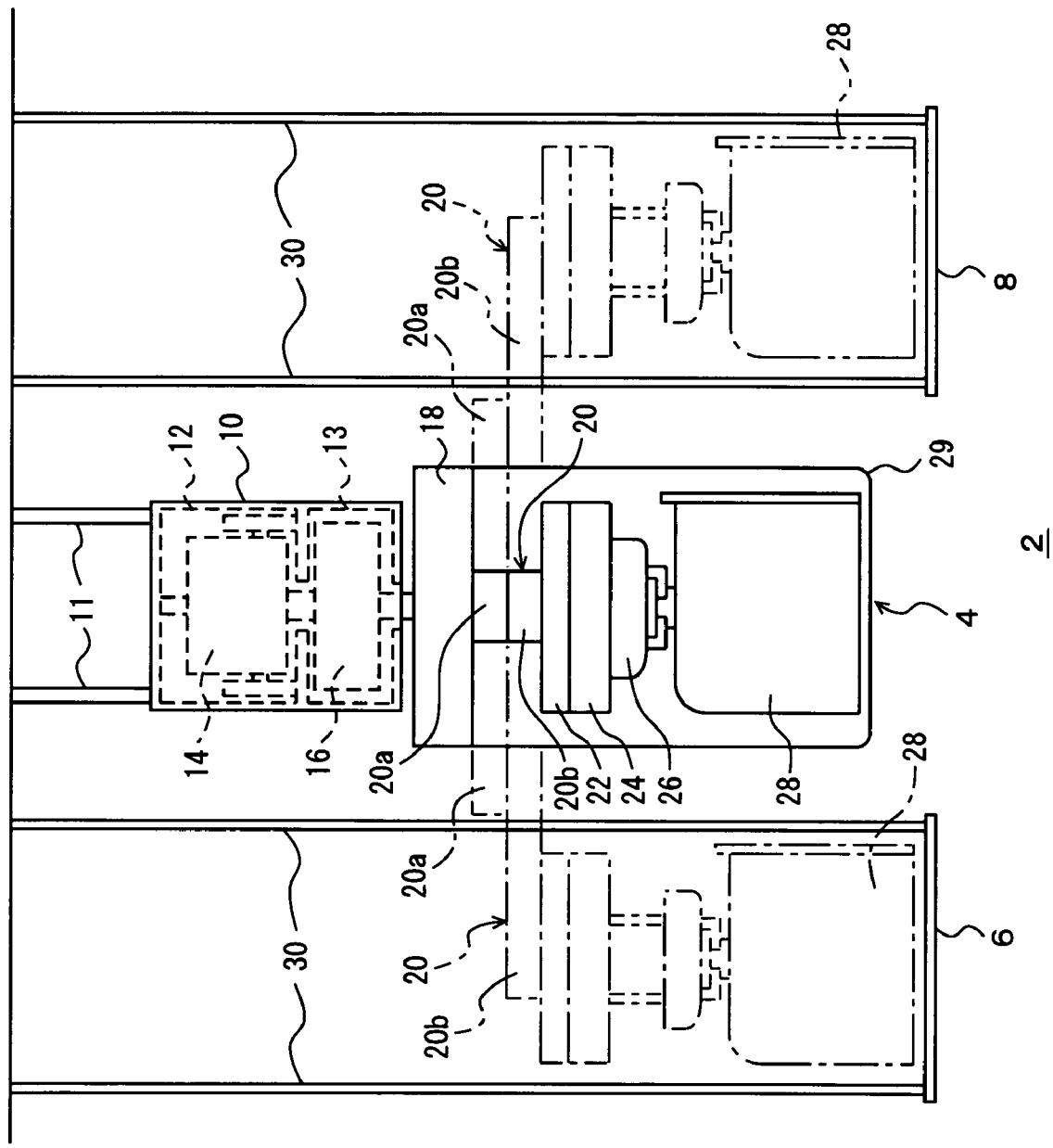
FIG. 1 is a front view showing main components of an overhead traveling vehicle system according to an embodiment, in which dashed dotted lines denote a state in which a SCARA arm has moved forward to a side opposite to processing equipment, and dashed double dotted lines denote a state in which the SCARA arm has moved forward to the processing equipment.

DESCRIPTION OF REFERENCE NUMERALS 2 overhead traveling vehicle system
4 overhead traveling vehicle
6, 8 side buffer
10 travel rail
11 support column
12 travel rail body
13 power feed rail
14 travel drive unit
16 power reception unit
18 body base
20 SCARA arm
22 rotation unit
24 elevation drive unit
26 elevation frame
28 article
29 fall prevention cover
30 support column
34 overhead traveling vehicle
36, 38 double speed belt mechanism
40 to 44 coupling unit
46, 48 ball screw
50, 52 processing equipment
54 empty space
56 branch section
58 merge section
60 normal line
62 bypass line
64 load port
68 side buffer
70 lower buffer
71 processing unit
72 branch/merge section
74 side buffer
76, 77 main line
78 single line segment

EMBODIMENT

FIGS. 1 to 8 show an embodiment and its modified embodiment. In the drawings, a reference numeral 2 denotes an overhead traveling vehicle system provided utilizing an overhead space, e.g., in a clean room. Articles 28 such as an FOUP containing a semiconductor wafer are transported between load ports, e.g., at processing equipment and an inspection apparatus. In the specification, the inspection apparatus is regarded as a type of the processing equipment. Types of transported articles can be determined arbitrarily. There are two types of travel routes, i.e., intra-bay routes having a U-shape in a bay where processing equipment are arranged, and inter-bay routes interconnecting the intra-bay routes. In each of the intra-bay routes and the inter-bay routes, overhead traveling vehicles 4 travel only in one direction. Mainly, the intra-bay route will be described with reference to the drawings. Side buffers 6, 8 are provided on both left and right sides of a travel rail 10 for the overhead traveling vehicle 4. In the embodiment, the side buffer 8 is a buffer on a side of the processing equipment, and the side buffer 6 is a buffer on a side opposite to the processing equipment as viewed from the travel rail 10.

Figure 2:
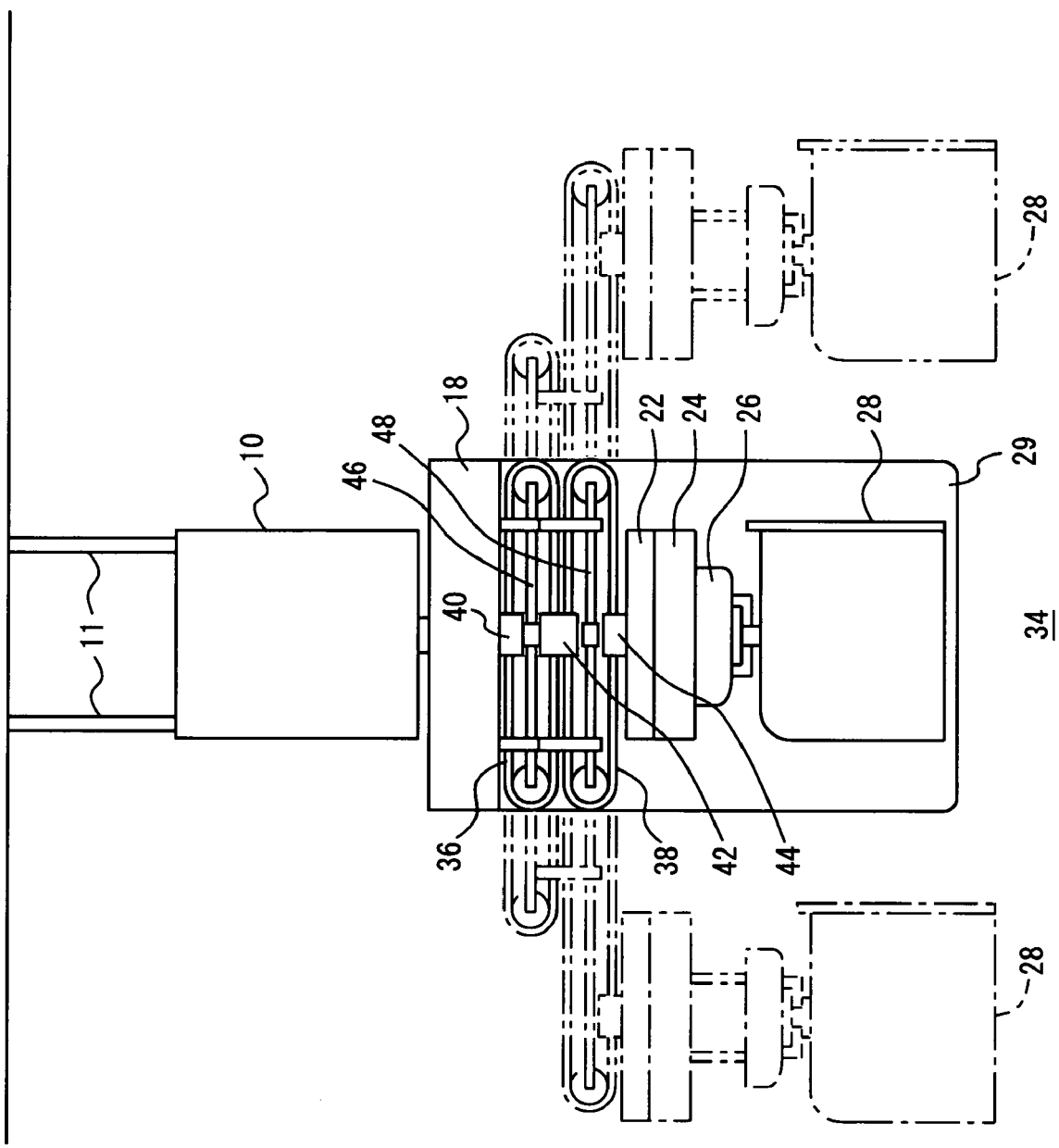
FIG. 2 is a front view showing main components of an overhead traveling vehicles according to a modified embodiment, in which dashed dotted lines denote a state in which a two-stage double speed belt has moved forward to a side opposite to processing equipment, and dashed double dotted lines denote a state in which the double speed belt has moved forward to the processing equipment.

The travel rail 10 is supported by, e.g., a ceiling of the clean room using support columns 11 or the like. The travel rail 10 is made up of a travel rail body 12 and a power feed rail 13. The overhead traveling vehicles 4 include a travel drive unit 14 for traveling inside the travel rail body 12. The overhead traveling vehicles 4 have a power reception unit 16 for receiving electricity from the power feed rail 13, and communicating with a system controller (not shown). A body base 18 of the overhead traveling vehicles 4 is positioned under the travel rail 10, and a SCARA arm 20 is provided as an example of lateral movement means for laterally moving a rotation unit 22, an elevation drive unit 24, an elevation frame 26, and the article 28 to the right or left in a direction substantially perpendicular to the traveling direction of the travel rail 10. A pair of fall prevention covers 29 are provided on both front and back sides of the overhead traveling vehicles 4 to sandwich the article 28 from the front and back sides. In FIGS. 1 and 2, the fall prevention cover 29 on the front side is not shown.

The SCARA arm 20 includes a pair of upper and lower arms 20a, 20b. During traveling, the arms 20a, 20b are overlapped vertically in a direction parallel to the travel rail 10. Thus, the rotation unit 22 is positioned just under the body base 18. At the time of laterally moving the article 28, as shown by dashed dotted lines in FIG. 1, by stretching the arms 20a, 20b, the article 28 moves laterally to a position above the side buffer 6. Further, by stretching the SCARA arm 20 as shown by dashed double dotted lines in FIG. 1, the article 28 moves to a position above the side buffer 8. Though the rotation angle of the rotation unit 22 may be a small range, e.g., within an angle between +5° and −5°, preferably, the rotation unit 22 is rotatable, e.g., 90° so that the article 28 can be oriented suitably to the processing equipment. The elevation drive unit 24 is supported by the rotation unit 22, and the elevation frame 26 is elevated/lowered by a suspension member such as a belt, a wire, or a rope. The elevation frame 26 can freely chuck/release an upper flange of the article 28 by a hand. Using the SCARA arm 20, the elevation frame 22, the elevation drive unit 24, and the elevation frame 26, the overhead traveling vehicles 4 can transfer the article 28 to the load port or the buffer 6, 8, at a position just under the article 28, or at a position on either of the left and right sides of the travel rail 10. Further, as necessary, it is possible to change the orientation of the article 28. In FIG. 1, reference numerals 30 denote support columns of the side buffers 6, 8.

Any lateral movement means can be adopted as long as it can laterally move the article 28 toward both of the left and right sides of the travel rail 10. In FIG. 2, the overhead traveling vehicles 34 have double speed belt mechanisms 36, 38 in two upper and lower stages for laterally moving the article 28. A coupling unit 40 fixes a belt of the upper double speed belt mechanism 36 to the body base 18. Further, using a drive mechanism such as a ball screw 46, the upper double speed belt mechanism 36 moves to the left and right by a predetermined stroke relative to the body base 18. A coupling unit 42 couples belts of the upper and lower double speed belt mechanisms 36, 38. Using a drive mechanism such as a ball screw 48, the lower double speed belt mechanism 38 moves to the left and right relative to the upper double speed belt mechanism 36. For example, it is assumed that the upper and lower double speed belt mechanisms 36 have moved to the left side in FIG. 2 by the same stroke using the ball screws 46, 48. Since the belt of the double speed belt mechanism 36 is fixed to the body base 18 by the coupling unit 40, the coupling unit 42 moves to the left by the amount twice as much as the stroke. Then, the coupling unit 44 moves to the left relative to the coupling unit 42 by the amount twice as much as the stroke of the ball screw 48. Thus, as shown by dashed dotted lines of FIG. 2, the article 28 moves to the left side of the travel rail 10 (in a direction opposite to the processing equipment). If the ball screws 46, 48 are driven in a reverse direction, as shown by dashed two dotted lines of FIG. 2, the article 28 moves to the right side of the travel rail 10 (toward the processing equipment).

Figure 3:
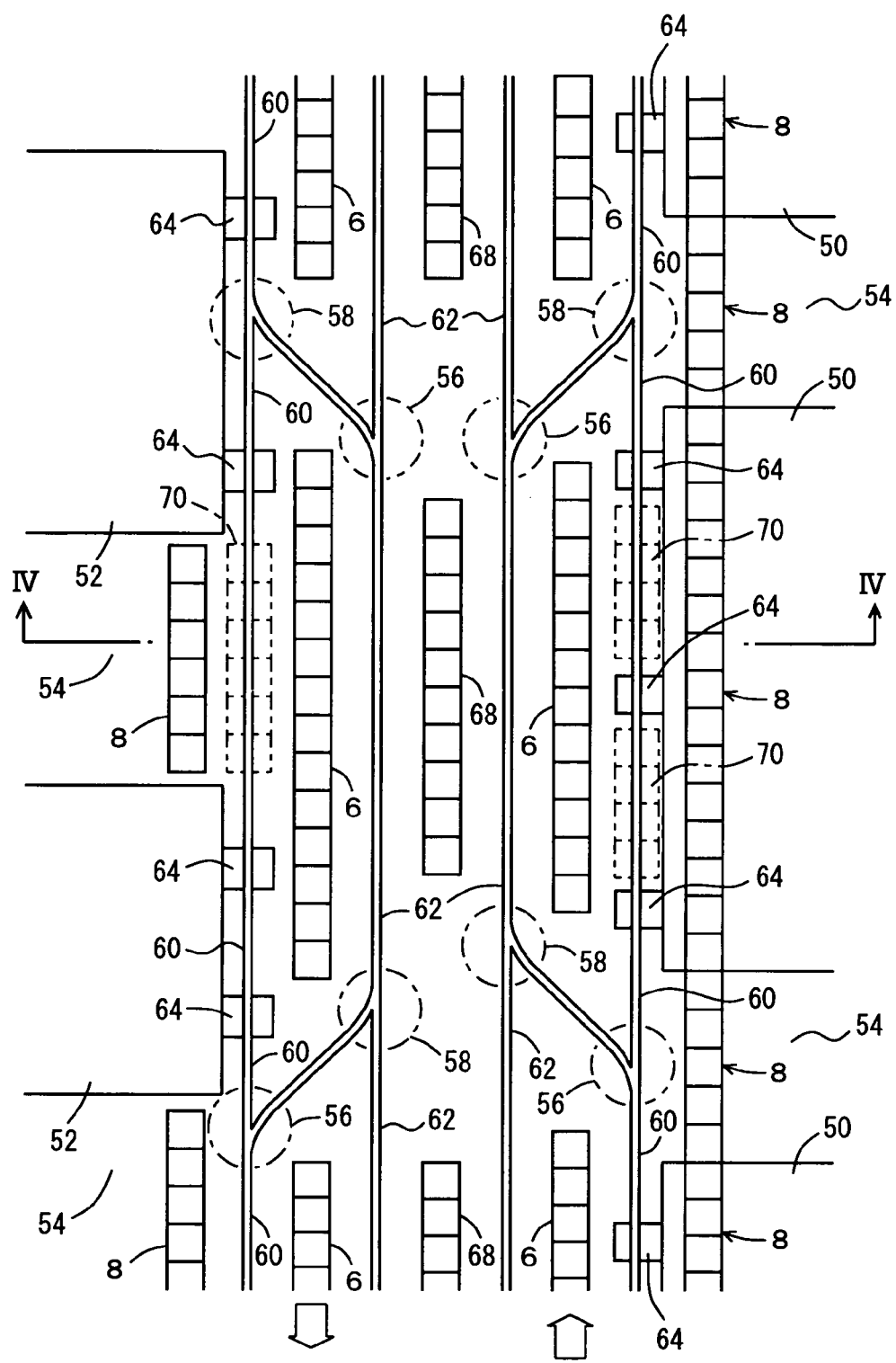
FIG. 3 is a plan view showing the layout of main components of the overhead traveling vehicle system according to the embodiment.
Figure 4:
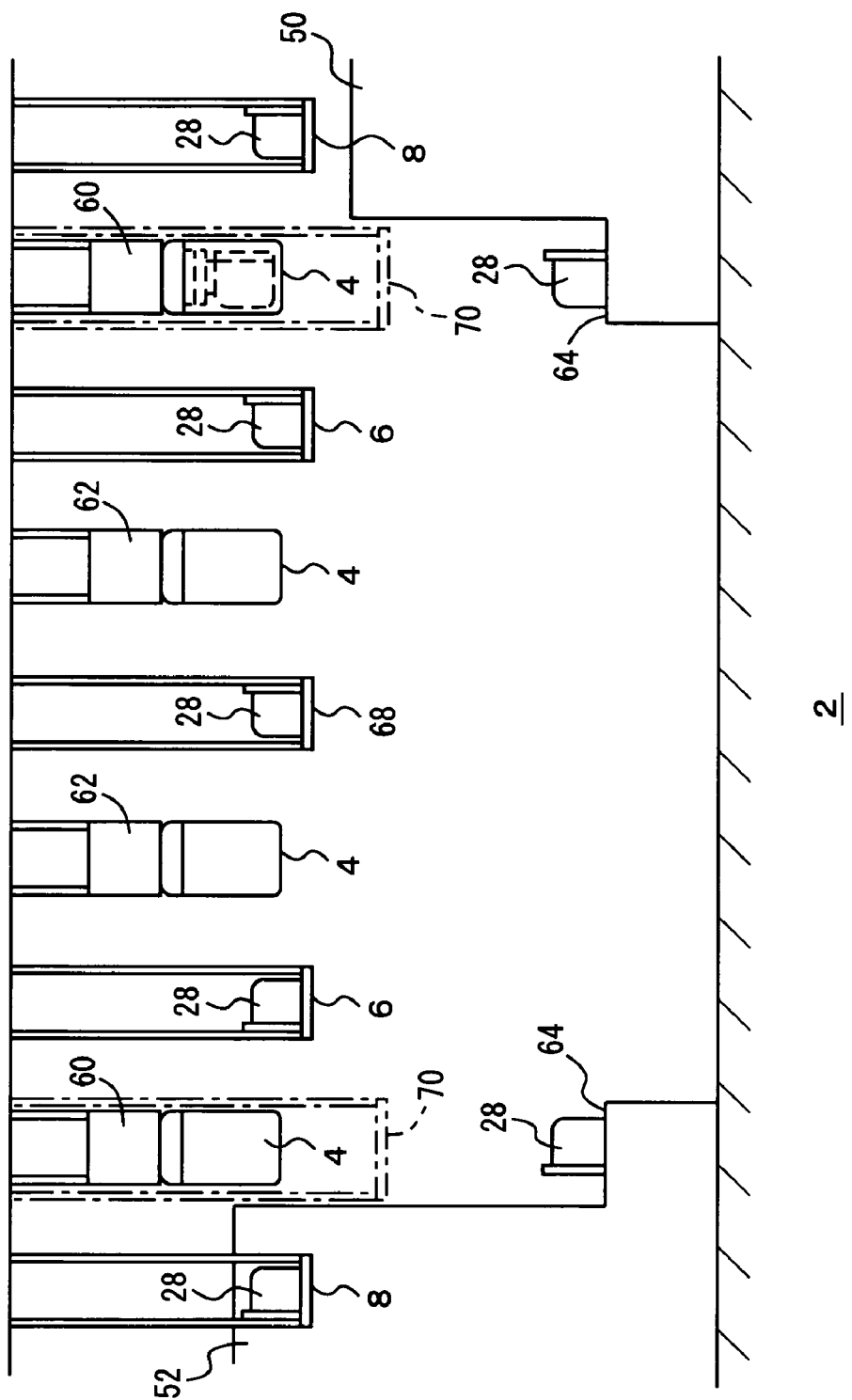
FIG. 4 is an enlarged view as viewed upwardly from the bottom side along a line IV-IV in FIG. 3.

FIGS. 3 and 4 show the layout of the overhead traveling vehicle system 2. Reference numerals 50, 52 denote processing equipment for processing a semiconductor or the like. The processing equipment may include an inspection apparatus. The height of the processing equipment 50 is small, and the side buffer 8 can be provided above the processing equipment 50. The side buffer 8 may be provided in an empty space 54 such as a passage. Reference numerals 56 denote branch sections, reference numerals 58 denote merge sections, and reference numerals 60 denote normal lines (travel rails in normal lanes) for transferring articles to/from the load ports 64 at the processing equipment 50. Reference numerals 62 denote bypass lines (travel rails in overtaking lanes). The normal line 60 and the bypass line 62 are in parallel, and connected at the branch section 56 or the merge section 58.

For the processing equipment 50 having the small height, the side buffer 8 is provided in the overhead space or the empty space 54 above the processing equipment 50. Further, for the processing equipment 52 having the large height, the side buffer 8 is provided in the empty space 54. In empty spaces between the load ports 64, lower buffers 70 are supported from the travel rail or the like for the overhead traveling vehicle. The lower buffers 70 may not be provided. Common side buffers 6 are provided between the normal line 60 and the bypass line 62. The article can be transferred from/to the common side buffer 6 to/from either of the overhead traveling vehicle traveling along the normal line 60 or the overhead traveling vehicle traveling along the bypass line 62. Further, side buffers 68 are provided between the left and right bypass lines 62. The article can be laterally moved to the side buffer 68 from either of the overhead traveling vehicle on the left side or the overhead traveling vehicle on the right side. The side buffers 68 may not be provided.

As a result, the capacity of the buffers in the overhead traveling vehicle system 2 is improved significantly. In particular, since it is possible to laterally move the article to both left and right sides of the overhead traveling vehicles 4 or the like, utilizing the empty space above the processing equipment 50, the side buffers 6, 8 can be provided on both of the left and right sides. Further, the side buffers 6, 68 can be provided on both of the left and right sides of the overhead traveling vehicles traveling along the bypass line 62. In the case where it is necessary to further improve the capacity of buffers, the lower buffers 70 can be provided. The side buffer 68 can be used as a buffer for the bypass lines 62 on both of the left and right sides, and also used to shortcut the transportation path by reversing the transportation direction of the article. For example, the article which has been transported in the right bypass line upwardly from a lower position in FIG. 3 is temporarily stored in the side buffer 68. By transporting the article from the side buffer 68 by the overhead traveling vehicles traveling along the left bypass line 62 of FIG. 3, it is possible to reverse the transportation direction from the upward direction to the downward direction in FIG. 3. At this time, if the orientation of the article to the processing equipment is not suitable, the article can be rotated twice by the angle of 90° using the rotation unit. In the case where the side buffer 6 between the normal line 60 and the bypass line 62 is used, it becomes sufficient for the overhead traveling vehicles 4 or the like traveling along the normal line 60 to transfer the article between the load port 64 and the side buffer 6. Transportation from the side buffer 6 to the destination point, and the transportation from the start point to the side buffer 6 can be handed by the overhead traveling vehicles 4 or the like traveling along the bypass line 62.

Figure 5:
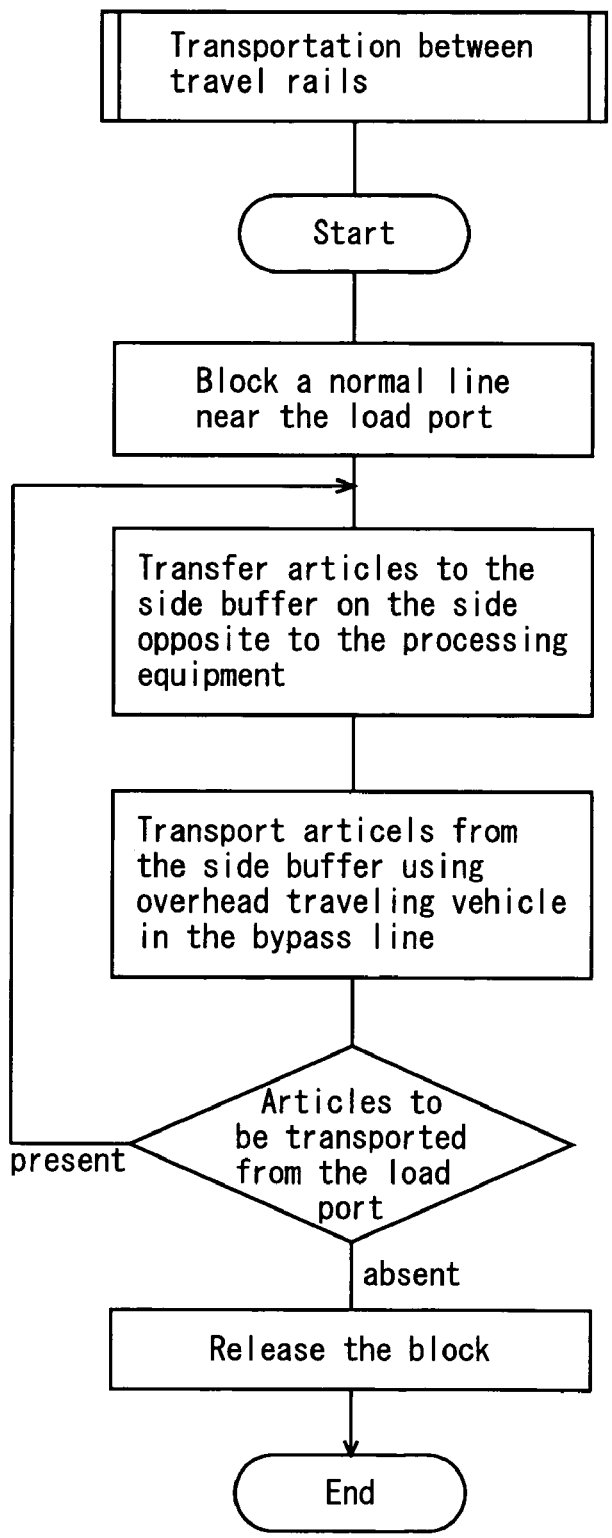
FIG. 5 is a flow chart showing an algorithm for successively transporting articles from a load port, by transfer of the articles from a normal line to a bypass line.

FIG. 5 shows an algorithm of successively transporting a plurality of articles from a load port. It is assumed that a normal line near the load port from which the articles are transported is blocked, and only one overhead traveling vehicle is allowed to travel in the blocked segment and the overhead traveling vehicle can move in both of the forward direction and the backward direction. In the meantime, the other overhead traveling vehicles move along the bypass line 62. The overhead traveling vehicle in the normal line moves back and forth in the blocked segment such that the article at the load port is transferred to the side buffer 6 on the side opposite to the processing equipment. At this time, if an accumulation conveyor is provided in the side buffer 6, the overhead traveling vehicle traveling along the normal line does not have to move back and forth, and it is sufficient to elevate/lower, and laterally move the elevation frame. The overhead traveling vehicle traveling along the bypass line 62 is loaded with the article 28 from the side buffer 6, and transports the article 28 to the destination point. The series of operations are repeated until transportation of all the necessary articles from the load port is finished. Then, the block of the normal line is released. The algorithm of FIG. 5 can be utilized also in the case of transporting a plurality of articles into the load port 64. In this case, the overhead traveling vehicle should unload the article from the side buffer 6 to the load port 64, and the overhead traveling vehicle in the bypass line 62 should transport the article to the side buffer 6.

Figure 6:
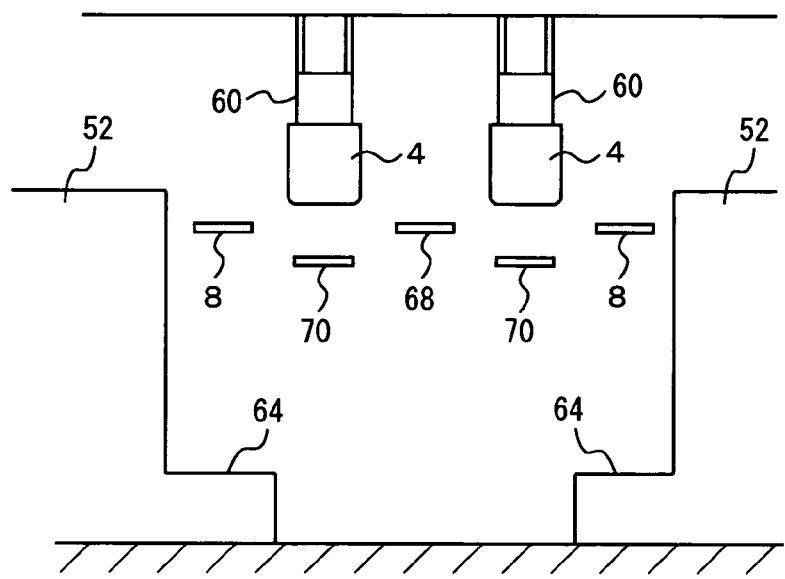
FIG. 6 is a front view showing the layout of main components, in which the number of buffers is the maximum in the overhead traveling vehicle system according to the embodiment.

The load port 64 is provided just under the travel rail 10 or the normal line 60 to avoid the decrease in the positional accuracy due to the lateral movement of the article. However, as shown in FIG. 6, the load port 64 may be provided on one left or right side of the normal line 60 so that the article can be transferred by both of the lateral movement and vertical movement of the elevation frame. In this case, preferably, the side buffers 8 are provided in empty spaces between the load ports 64 and the common buffer 68 is provided between a pair of the normal lines 60 of which the traveling directions are opposite to each other.

Figure 7:
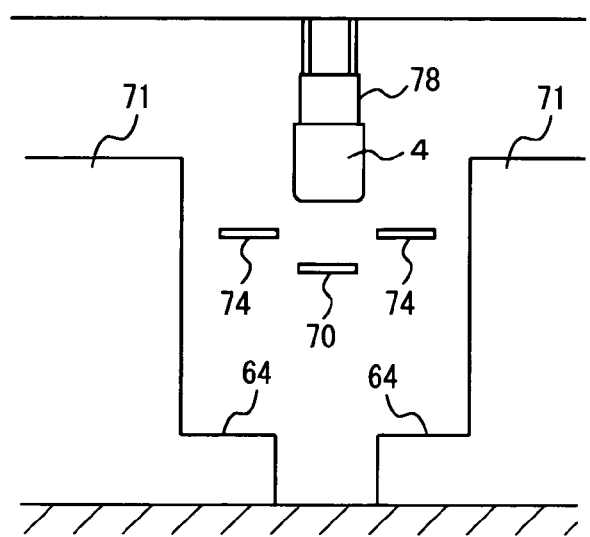
FIG. 7 is a front view showing the layout of main components, suitable for a case in which processing equipment having a low speed are used in the overhead traveling vehicle system according to the embodiment.
Figure 8:
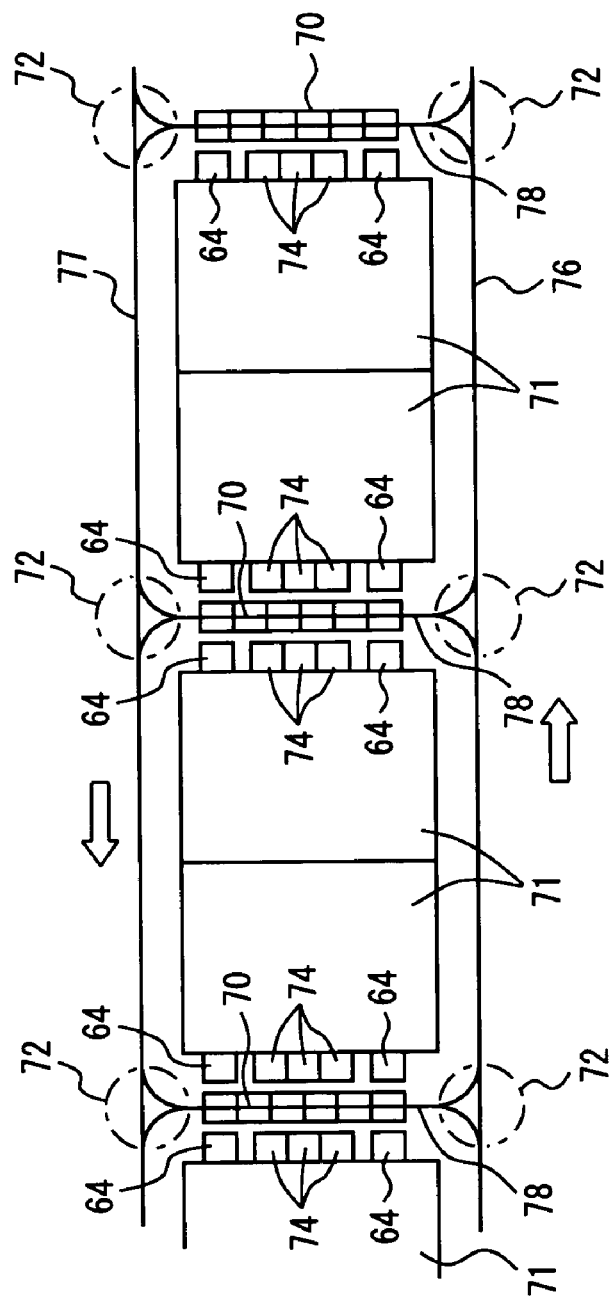
FIG. 8 is a plan view showing the layout of main components in FIG. 7.

FIGS. 7 and 8 show an example in which the overhead traveling vehicle does not move in the bay in a U-shape pattern, and single line segments 78 of the travel rail are provided in the bay. Reference numerals 71 denote processing equipment, reference numerals 72 denote branch/merge sections, and reference numeral 74 denote side buffers. The article can be transferred from the overhead traveling vehicle traveling along the single line segment 78. Reference numerals 76, 77 denote main lines. The traveling directions of the main lines 76, 77 are shown by arrows in FIG. 8.

In the example, the number of overhead traveling vehicles that can enter the single line segment 78 at the same time is limited to one, and the article is temporarily stored in the side buffer 74 or the lower buffer 70. For the bay where processing equipment 71 having a low processing speed are used, the number of travel rails is reduced from two to one, and the required space is reduced. In the system, the branch/merge sections 72 are provided, and the overhead traveling vehicle can move back and forth in the single line segment 78. Therefore, the travel route of the overhead traveling vehicle can be selected freely. The layouts of FIGS. 6, 7, and 8 are used as part of the layout of the overhead traveling vehicle system 2.

The invention claimed is:

1. An overhead traveling vehicle system, comprising:
a travel rail in a normal lane provided along a processing equipment, the processing equipment having a load port;
a travel rail in an overtaking lane;
an overhead traveling vehicle for transferring an article to the load port, the overhead traveling vehicle having an elevation frame for support and transfer of the article and a lateral movement means for moving the elevation frame in a left-right direction of the travel rail in the normal lane and for moving the elevation frame in a left-right direction of the travel rail in the overtaking lane; and
buffers for temporarily storing the article provided in spaces along side of the travel rail in the normal lane and along side of the travel rail in the overtaking lane, the buffers including a first buffer located along a first side of the travel rail in the normal lane and a second buffer located along a second side of the travel rail in the normal lane opposite the first side,
wherein the travel rail in the normal lane is between the first and second buffers with the first and second buffers facing each other, and the second buffer is between the travel rail in the normal lane and the travel rail in the overtaking lane,
wherein the article can be transferred directly to the first buffer and the second buffer from the overhead traveling vehicle positioned along the travel rail in the normal lane, and
wherein the article can be transferred directly to the second buffer from the overhead traveling vehicle positioned along the travel rail in the overtaking lane.

2. The overhead traveling vehicle system according to claim 1, wherein the travel rail in the normal lane is provided to pass over the load port, and the buffers are provided at both of a position above the processing equipment, and a position opposite to the processing equipment as viewed from the travel rail.

3. The overhead traveling vehicle system according to claim 1, wherein the buffers comprise rows of cells for supporting the articles parallel with the traveling rail in the normal lane and parallel with the traveling rail in the overtaking lane.

4. A method of storing an article using an overhead traveling vehicle system, the overhead traveling vehicle system including a travel rail in a normal lane provided along processing equipment having a load port for an overhead traveling vehicle and including a travel rail in an overtaking lane, the overhead traveling vehicle having an elevation frame which can be elevated/lowered for support and transfer of the article and having lateral movement means for laterally moving the elevation frame to both of left and right sides of the travel rail, and buffers for temporarily storing the article provided in spaces along side of the travel rail in the normal lane and along side of the travel rail in the overtaking lane, the buffers including a first buffer located along a first side of the travel rail in the normal lane and a second buffer located along a second side of the travel rail in the normal lane opposite the first side, and the second buffer is located along side the travel rail in the overtaking lane, the method comprising:
the overhead traveling vehicle traveling along the travel rail in the normal lane;
the overhead traveling vehicle laterally moving the elevation frame to the first side of the travel rail in the normal lane using the lateral movement means to directly transfer the article to the first buffer from the overhead vehicle traveling along the travel rail in the normal lane;
the overhead traveling vehicle laterally moving the elevation frame to the second side of the travel rail in the normal lane using the lateral movement means to directly transfer the article to the second buffer from the overhead traveling vehicle traveling along the travel rail in the normal lane;
the overhead traveling vehicle traveling along the travel rail in the overtaking lane;
the overhead traveling vehicle laterally moving the elevation frame to the second buffer using the lateral movement means to directly transfer the article to the second buffer from the overhead traveling vehicle traveling along the travel rail in the overtaking lane; and
the overhead traveling vehicle laterally moving the elevation frame to a position above a buffer using the lateral movement means, and elevating/lowering the elevation frame for transferring the article from/to the buffer.

* * * * *